United States Patent
Adams

(10) Patent No.: US 6,828,083 B2
(45) Date of Patent: Dec. 7, 2004

(54) PHOTORESIST COMPOSITIONS AND USE OF SAME

(75) Inventor: Timothy G. Adams, Sudbury, MA (US)

(73) Assignee: Shipley Company, L.L.C., Marlborough, MA (US)

(*) Notice: Subject to any disclaimer, the term of this patent is extended or adjusted under 35 U.S.C. 154(b) by 0 days.

(21) Appl. No.: 09/825,070

(22) Filed: Apr. 3, 2001

(65) Prior Publication Data

US 2001/0053496 A1 Dec. 20, 2001

Related U.S. Application Data

(60) Provisional application No. 60/194,287, filed on Apr. 3, 2000.

(51) Int. Cl.$^7$ .......................... G03C 1/73; G03F 7/039; G03F 7/20; G03F 7/30; G03F 7/40
(52) U.S. Cl. ................. 430/326; 430/325; 430/330; 430/331; 430/311; 430/328; 430/270.1; 430/905; 430/910
(58) Field of Search .............. 430/270.1, 326, 430/330, 331, 311, 328, 905, 910, 325

(56) References Cited

U.S. PATENT DOCUMENTS 5,338,626 A * 8/1994 Garofalo et al. ............... 430/5
6,022,665 A * 2/2000 Watanabe et al. ......... 430/270.1
6,033,830 A * 3/2000 Sinta et al. .................. 430/325
6,241,857 B1 * 6/2001 Yamada .................. 204/192.12
6,358,672 B2 * 3/2002 Jeoung et al. ............... 430/311

FOREIGN PATENT DOCUMENTS

| | | |
|---|---|---|
| DE | 39 20 481 A | 1/1990 |
| EP | 0 788 031 A | 8/1997 |
| EP | 0 939 339 A | 9/1999 |
| EP | 0 939 340 A | 9/1999 |

* cited by examiner

*Primary Examiner*—Cynthia H. Kelly
*Assistant Examiner*—Sin J. Lee
(74) *Attorney, Agent, or Firm*—Peter F. Corless; Darryl P. Frickey; Edwards & Angell, LLP

(57) ABSTRACT

Compositions and methods of the invention provide for a controlled flow of resist into device contact (via) holes during a post-exposure, post-development hard-bake step. Resists of the invention are positive-acting and contain one or more components that are preferably substantially stable (i.e. no substantial crosslinking) during: 1) soft-bake, pre-exposure thermal treatment to remove solvent carrier of the applied resist, and 2) post-exposure, pre-development thermal treatment to promote or enhance the acid-promoted reaction in exposed regions (typically a de-blocking reaction). However, resists of the invention will crosslink during a post-development more stringent thermal treatment (thermal flow hard-bake step).

29 Claims, No Drawings

PHOTORESIST COMPOSITIONS AND USE OF SAME

The present application claims the benefit of U.S. provisional application No. 60/194,287, filed Apr. 3, 2000, which is incorporated herein by reference.

BACKGROUND OF THE INVENTION

1. Field of the Invention

The present invention relates to new photoresists, particularly photoresists that can crosslink after a development step, typically through thermal treatment. Resists of the invention are particularly useful to provide thermal flow coverage of semiconductor contact holes.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

Chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photo-initiators have been used to induce cleavage of certain "blocking" groups pendant from a photoresist binder, or cleavage of certain groups that comprise a photoresist binder backbone. See, for example, U.S. Pat. Nos. 5,075, 199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer. See also R. D. Allen et al., *Proceedings of SPIE*, 2724:334–343 (1996); and P. Trefonas et al. *Proceedings of the 11th International Conference on Photopolymers* (*Soc. Of Plastics Engineers*), pp 44–58 (Oct. 6, 1997).

Microelectronic devices frequently have multiple metal interconnection or conductive layers that are each separated by interposed insulating (dielectric) layers. The multiple conductive layers are connected using contact hole or via holes through the dielectric layers. See, generally, S. Sze, *VLSI Technology* (2nd ed., New York, McGraw-Hill, 1988), for a discussion of semiconductor device fabrication techniques.

SUMMARY OF THE INVENTION

I have now found improved compositions and methods for the fabrication of microelectronic devices. In particular, compositions and methods of the invention provide for a controlled flow of resist into device contact (via) holes during a post-exposure, post-development hard-bake step.

Resists of the invention are positive-acting and contain one or more components that are preferably substantially stable (i.e. no substantial crosslinking) during: 1) soft-bake, pre-exposure thermal treatment to remove solvent carrier of the applied resist, and 2) post-exposure, pre-development thermal treatment to promote or enhance the acid-promoted reaction in exposed regions (typically a de-blocking reaction). However, resists of the invention will crosslink during a post-development more stringent thermal treatment (thermal flow hard-bake step). By such selective crosslinking, the thermal flow rate of the applied resist into the contact holes can be controlled to within a desired range.

I have found that the use of such a thermal flow hard-bake when processing a contact hole resist can enable obtaining smaller critical dimensions than possible without post-development hard-bake processing. The hard bake (e.g. at least about 120° C., more typically at least about 130° C. or 140° C., suitably from about 130° C. to about 140° C. to about 180° C. or about 190° C.) allows the resist to flow after development. However, in the absence of post-development crosslinking, the hard bake can produce too fast of a flow rate, which can limit resolution of formed features.

One preferred resist for use in accordance with the invention contains a photoactive component (typically a photoacid generator) and a resin with acetal and/or ketal moieties. The term "acetal" as used herein is inclusive of both acetal and ketal moieties, unless otherwise indicated. During a stringent post-development thermal flow hard-bake step, the resin can crosslink, typically by a transacetalation reaction. The hard-bake thermal treatment will cause flow of the resist as desired into a contact hole feature over which the resist has been applied, while the resist crosslinking will restrict the resist flow rate to a desired rate. At resist flow, the resist resin typically is above its Tg.

Suitable resist components that contain acetal groups that will react (crosslink) during a post-development hard-bake can be provided by a variety of routes. For instance, a vinyl ether (e.g. t-butyl vinyl ether) can be reacted with a hydroxy moiety such as phenolic —OH group to provide an acetal that will undergo reaction (particularly transacetalation) during a post-development hard-bake. Thus a polymer or copolymer containing phenolic units, such as a poly (vinylphenol) polymer or compolymer, can be reacted with a vinyl ether to provide the thermally reactive acetal moieties.

A variety of other resist systems can be employed in accordance with the invention provided one or more components of the resist can undergo crosslinking during a stringent hardbake step, but remain substantially stable (i.e. no substantial crosslinking) during prior thermal processing (i.e. pre-exposure soft bake and post-exposure, pre-development bake). For example, resists can employed that contain a resin that can contains ester groups (e.g. t-butyl ester groups) that can undergo crosslinking, such as by a transacetalation reaction.

Resists of the invention will typically contain separate components or functionalities that will be photoacid-labile and will be reactive upon exposure and any post-exposure, pre-development thermal treatment. Preferred photoacid-labile groups include acetal groups that are more reactive to photoacid-induced deblocking than the moieties that will crosslink during a post-development, hard-bake step. For instance, a resist resin can be employed that has both primary or second acetal groups and a tertiary acetal, or a primary acetal and a second or tertiary acetal. Without being bound by theory, the more branched acetal (i.e. secondary or tertiary) will more preferentially undergo transacetalization (crosslinking) at hard-bake temperatures, relative to a less substituted (i.e. primary or secondary) acetal, which less-substituted acetals will more preferentially de-block in the presence of photoacid after exposure and prior to development. See Scheme 1 below.

Resists of the invention also may contain a thermal acid generator, which is substantially stable to temperatures of a soft-bake step or a post-exposure, pre-development heat treatment, but can be activated to generate acid during more stringent temperatures of a post-development hard-bake step. The thermally generated acid then can promote crosslinking between resist component(s). However, in at least certain aspects of the invention, use of a thermal acid generator will be less preferred to avoid degradation of the resist during storage prior to use.

Resins used in resists of the invention can include a variety of units, including aromatic groups e.g. phenolic groups; cyano groups such as provide by polymerization of acrylonitrile or methacrylonitrile; and the like.

Polymers of the invention also may be substantially, essentially or completely free of phenyl or other aromatic groups, particularly for short wavelength imaging applications, such as 193 nm, 157 nm and other sub-200 nm wavelength exposures where aromatic groups can absorb excessive exposure radiation. Preferably such polymers have less than about 5 mole percent aromatic groups, based on the total polymer, more preferably less than about 3, 2, 1, 0.5, or 0.1 mole percent aromatic groups. Particularly preferred polymers for such wavelength imaging will be completely free of aromatic groups.

References herein to "crosslinking" or other similar term are intended to refer to essentially any covalent linkage between polymer chains or sites.

References herein that a polymer or other component "does not undergo substantial crosslinking" or other similar phrase indicates that less than 20 mole percent of crosslinkable groups (i.e. crosslinkable upon subsequent more stringent post-development hard-bake) of the crosslinkable polymer or other component do not react upon exposure to a stated temperature for 60 seconds. Thus, for example, references herein that a polymer does not substantially crosslink at a post-exposure, pre-development bake of 120° C. indicates that less than about 20 mole percent of crosslinkable polymer units (i.e. acetal or other units that can crosslink during the subsequent more stringent hard-bake) will crosslink during a 60 second exposure to the 120° C. pre-development bake.

The invention also provides methods for forming relief images, including methods for forming a highly resolved relief image, and processing of contact (via) holes in microelectronic devices. The invention further provides articles of manufacture comprising substrates such as a microelectronic wafer with or without one or more contact (via) holes. Other aspects of the invention are disclosed infra.

DETAILED DESCRIPTION OF THE INVENTION

As discussed above, resists of the invention contain one or more components that can undergo crosslinking during a post-development, hard-bake step.

Preferably, resists of the invention comprise a polymer that contains one or more functional groups that can provide crosslinking between polymer chains or sites during a post-development thermal treatment. Crosslinking may be provided by direct linking of two polymer sites or chains, or by use of a separate crosslinking component that can covalently link multiple polymer sites or chains.

As discussed above, the resists should not significantly crosslink during pre-exposure softbake temperatures (e.g. about 110° C. or less, for about no more than about 1 minute) or during any post-exposure, pre-development thermal treatment that may be employed to promote the latent image patterned into exposed resist areas. Such post-exposure, pre-development thermal treatment is frequently conducted at about 110° C., 120° C. or 125° C. for no more than about 1 minute. Suitably a photoresist is heated after exposure and prior to development at a temperature of not greater than about 120° C., and pre-development heating does not cause substantial crosslinking of the photoresist layer.

As discussed above, preferred resists for use in accordance with the invention contain a resin that has acetal units, particularly tertiary or secondary alcohol units, such as units of the following Formula I:

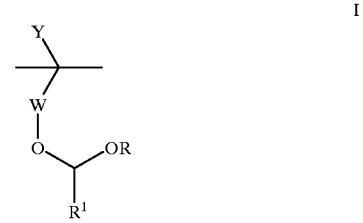

wherein W is a linker group to the polymer backbone such as a chemical bond, an aromatic group particularly a phenyl group (such as provided by polymerization of hydroxystyrene), an alicyclic group particularly a cyclohexyl group (such as provided by hydrogenation of a phenyl group, or polymerization of vinylcyclohexanol), or adamantyl, polymerized norbornene units or the like;

R is an optionally substituted cyclic or non-cyclic alkyl group suitably having from 1 to about 20 carbons, more preferably about 3 to about 16 carbons, and preferably R is a secondary or tertiary alkyl group such as t-butyl, sec-butyl, isopropyl, cyclohexyl, cyclopentyl and the like;

$R^1$ is hydrogen or a cyclic or non-cyclic alkyl group suitably having from 1 to about 20 carbons such as methyl, ethyl and the like, and preferably $R^1$ is methyl;

Y is hydrogen or optionally substituted alkyl such as $C_{1-6}$ alkyl particularly methyl.

Without being bound by any theory, the following Scheme 1 depicts two possible routes (Routes 1 and 2) of reaction for an acetal resist units. Route II is a crosslinking reaction which will be favored where the depicted R has a substituted carbon linked to the oxygen (i.e. a secondary or tertiary oxygen) to thereby stabilize the oxonium ion intermediate that can undergo a transacetalization reaction (e.g. through a vinyl ether as exemplified by the phenoxy vinyl ether depicted below). Route I will be largely driven by an excess of acid, which will be present as photogenerated acid in exposed regions of the a resist layer. Route II also is promoted by acid, which can be present from adsorption from the external environment, diffusion of photogenerated acid into unexposed resist layers, or otherwise present such ass residual acid from the resist resin synthesis. A thermal acid generator that is activated at post-development hard bake temperatures also can be employed to promote the crosslinking reaction, although such a thermal acid generator is generally less preferred as discussed above.

Scheme 1

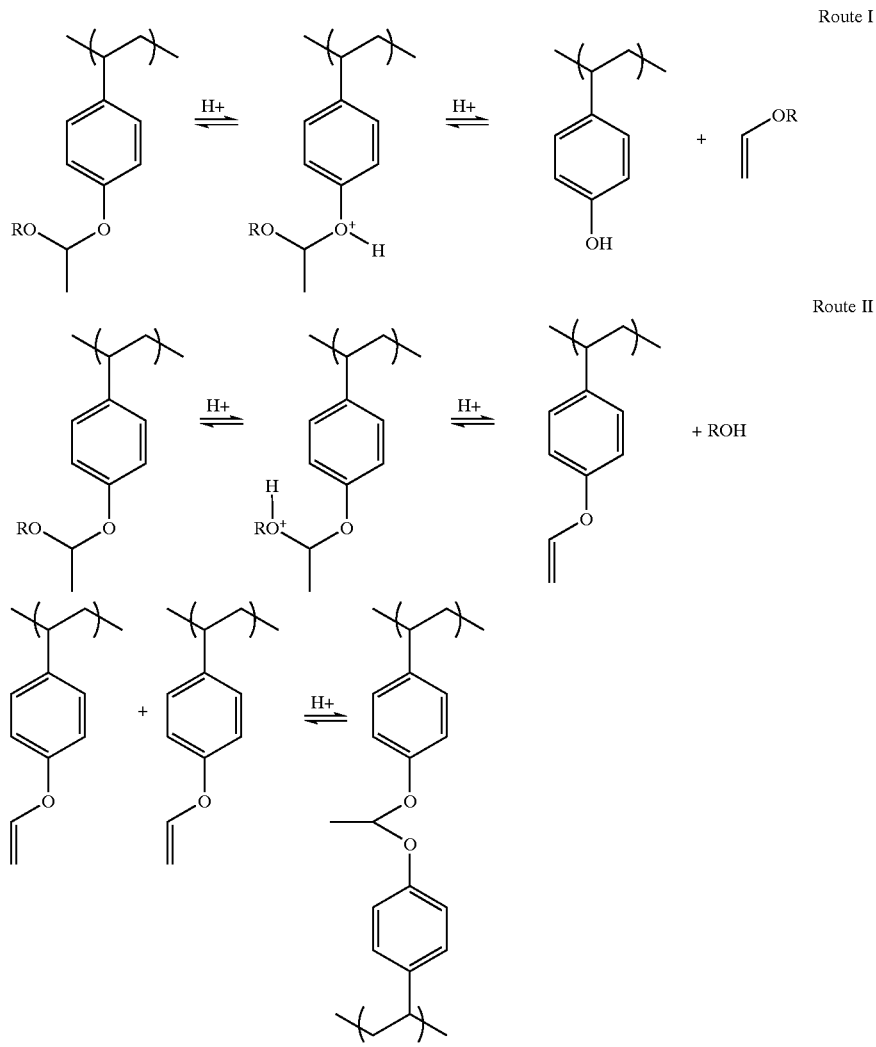

It is also preferred to include cycloalkyl (e.g. cyclhexyl, cyclopentyl) units in a polymer with acetal substituents. Such acetal units, particularly formed with secondary or tertiary vinyl ethers (e.g. cyclohexylvinyl ether or t-butlyvinyl ether), can proceed at relatively low hard-bake temperatures. For instance, Scheme 2 below depicts such a suitable system, where the cycloalkyl units are depicted as pendant cyclohexyl groups substituted with acetal moieties. In Scheme 2, Route III depicts the deblocking reaction, and Route IV depicts a crosslinking reaction.

Scheme 2

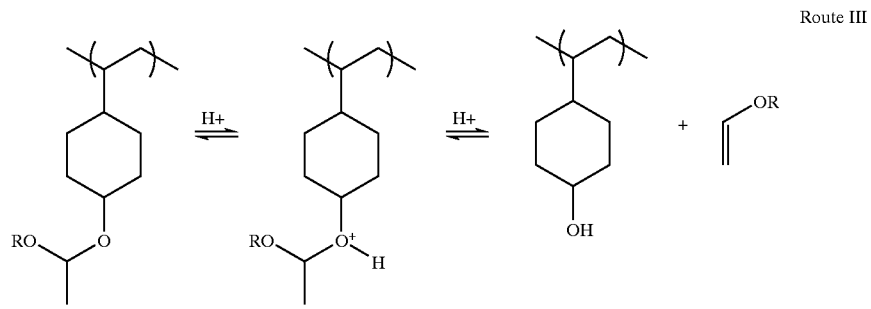

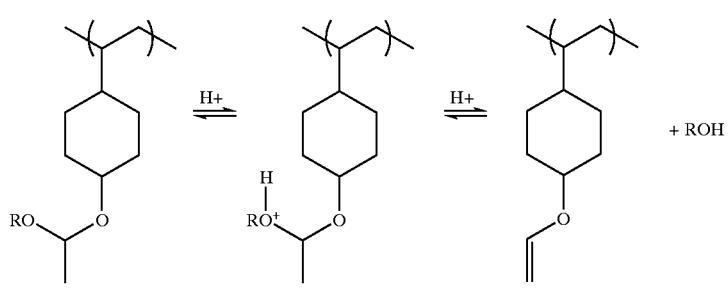

Route IV

As discussed above, polymers of the invention also include units that undergo reaction in the presence of photogenerated acid, particularly a cleavage reaction to provide polar moieties such as carboxy (COOH), or hydroxy. Such acid labile groups are suitably pendant to the polymer backbone. Acrylate groups can be suitable and can be formed by free radical or other condensation of monomers of one or more substituted or unsubstituted alkyl acrylates such as t-butylacrylate and t-butylmethacrylate. Acrylacetate groups are also generally preferred and can be formed by free radical or other condensation of monomers of one or more substituted or unsubstituted alkyl acrylates such as t-butylacrylacetate, t-butylacryloxyacetate and t-butylmethacryloxyacetate. Suitable monomers are commercially available or can be readily prepared by known procedures. The pendant substituted ester moiety of the condensed acrylate unit, i.e. R—O—C(=O)—, serves as the pendant acid labile groups. A wide variety of acrylate units may be employed including those having an ester group (group R above) that is a non-cyclic or cyclic alkyl having 1 to about 14 carbon atoms, more typically 1 to about 8 carbons. Preferably the group R may be a tertiary non-cyclic alkyl such as t-butyl, or a second or tertiary alicyclic group such as adamantyl including 2-methyladamantyl, isobornyl, norbornyl and the like. Also suitable will be such alkyl ester groups that have one or more substituents such as halogen, particularly F, Cl or Br, $C_{1-6}$ alkoxy, aryl such as phenyl, etc. Exemplary compounds that may be condensed to provide acrylate units of the polymers of the invention include butylacryloxyacetate including t-butylacryloxyacetate, butylmethacryloxyacetate including t-butylmethacryloxyacetate, etc. Suitable acrylate acid-labile groups also include those of the formula $R^3O(C=O)R^2R^1C-$ where $R^1$ and $R^2$ are each independently selected from the group of hydrogen, substituted or unsubstituted $C_{1-10}$ alkyl, substituted or unsubstituted alkyloxyacetate or an electron-withdrawing group such as halogen; and $R^3$ is substituted or unsubstituted $C_{1-14}$ alkyl, substituted or unsubstituted aryl such as phenyl or substituted or unsubstituted aryalkyl such as benzyl. The substituents of substituted groups can be, e.g., halogen, $C_{1-6}$ allyl $C_{1-6}$ alkoxy, phenyl or other aryl, etc. Such acetate groups may be provided as described above for acrylate groups, i.e., by free radical or other condensation of monomers of one or more substituted or unsubstituted vinyl acetates such as allyl acetate and the like. Other suitable acid labile groups include those disclosed e.g. in U.S. Pat. Nos. 5,362,600; 4,968,581; 4,883,740; 4,810,613; and 4,491,628.

Generally preferred however, are polymers that contain mixed acetal units, e.g. acetal units that have primary alkyl substitution (e.g. $R^1$ in Formula I above is a primary alkyl) that will readily undergo photoacid-induced cleavage, and secondary and tertiary acetals (e.g. $R^1$ in Formula I above is a secondary or tertiary alkyl) that will undergo thermally-induced crosslinking in non-exposed resist areas after development.

Polymers of the invention may comprise units in addition to crosslinking groups groups and acid labile groups. For instance, a polymer of the invention may contain phenolic units such as may be provided by reaction of hydroxystyrene or hydroxy(α-methyl)styrene, acid units such as may be provided by reaction of acrylic acid, methacrylic acid, and the like. Polymers of the invention also may suitably contain units that are essentially unreactive under typical lithographic conditions (photoacid and temperatures of about up to 180° C. for no more than about 60 seconds) such as phenyl groups that may be provided by reaction of styrene, and alkyl and alicyclic groups such as may be provided by various vinyl monomers e.g. vinyl norborene and the like. Other preferred polymer units include nitrile units such as may be provided by reaction of acrylonitrile and methacrylonitrile.

References herein to "optionally substituted" moieties or "substituted" moieties indicate that the specified group may be substituted with a relatively wide variety of non-hydrogen groups such as halogen (particularly F, Cl or Br), $C_{1-8}$ alkyl, $C_{1-8}$ alkoxy, aryl particularly carbocyclic aryl such as phenyl, nitro, cyano, $C_{1-8}$ alkylsulfonyl such as mesyl and the like.

Polymers of the invention can be prepared e.g. by free radical polymerization, e.g. by reaction of a plurality of monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). See the examples which follow for exemplary reactions conditions. Suitable reaction temperatures for any particular system can be readily determined empirically by those skilled in the art based on the present disclosure.

A reaction solvent may be employed if desired. Suitable solvents include propyleneglycol monomethylether acetate (PMA), or alcohols such as propanols and butanols as well as aromatic solvents such as benzene, chlorobenzene, toluene and xylene. Dimethyl sulfoxide and dimethylformamide are also suitable. The polymerization reaction also may be run neat.

A variety of free radical initiators may be employed to prepare the copolymers of the invention. For example, azo compounds may be employed such as azo-bis-2,2'-isobutyronitrile (AIBN) and 1,1'-azo-bis (cyclohexanecarbonitrile). Peroxides, peresters, peracids and persulfates also can be employed.

Monomers that contain hydroxy (such as para-hydroxystyrene) or other reactive moieties may be condensed in "masked" form if desired to facilitate polymer synthesis. For example para-acetoxystyrene may be employed as a "masked" form of para-hydroxystyrene. Other hydroxy masking or protecting groups also will be suitable such as alkylsilyl groups (to form silylethers with the hydroxy moiety), e.g. $(CH_3)_3Si$—, $(CH_3)_2(butyl)Si$—, $((CH_3)_3C)_3Si$—, etc.; other alkyl esters, e.g. $CH_3CH_2C(=O)$—, etc. After reaction completion, the masking groups may be removed under basic conditions. For example, the formed polymer may be heated in the presence of a base such as $NH_4OH$ or $NH_4OAc$.

A resin may have a generally minor amount of units that can undergo post-development hard-bake crosslinking. For example, suitably less than about 50 mole percent of total polymer units may be reactive to post-development, hard-bake crosslinking, such as up to about 10, 20, 30, 40 or 45 mole percent of total polymer units. If desired, higher amounts of the crosslinkable-groups also could be employed.

Generally preferred polymers for use in resists of the invention may have a weight average molecular weight (Mw) of 1,000 to about 100,000, more preferably about 2,000 to about 30,000 with a molecular weight distribution (Mw/Mn) of about 3 or less, more preferably a molecular weight distribution of about 2 or less. Molecular weights (either Mw or Mn) of the polymers of the invention are suitably determined by gel permeation chromatography. Suitable molecular weight distributions of copolymers of the invention include from about 1 to 5, more typically from about 1 to 3 or 4.

As discussed above, resists of the invention also may comprise a thermal acid generator compound that will be significantly activated only at post-development hard-bake temperatures, i.e. the thermal acid generator is stable to typical soft-bake (90° C.–110° C. for 60 seconds) and post-exposure, pre-development (120° C. for 60 seconds) thermal treatments. For example, a suitable thermal acid generator is nitrobenzylmesitylate which generates acid at about 160° C., a generally preferred hard-bake temperature. The thermally generated acid can promote crosslinking of resist components, as discussed above with respect to Route II of Scheme 1 and Route IV of Scheme 2.

Resists of the invention also will comprise a photoactive component in addition to a resin component. Photoactivation of a coating layer of the resist results in a cleavage or other reaction of the polymer acid labile groups. The polymer component should be used in an amount sufficient to render a coating layer of the resist developable with an aqueous alkaline developer. The photoactive compounds typically includes a photoacid generator (i.e. "PAG") that is suitably employed in an amount sufficient to generate a latent image in a coating layer of the resist upon exposure to activating radiation.

One group of preferred PAGs for use in the resists of the invention include imidosulfonates such as compounds of the following formula:

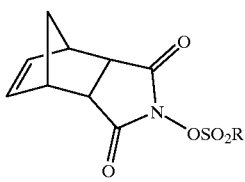

wherein R is camphor, adamantane, alky (e.g. $C_{1-12}$ alkyl) and perfluoroalkyl such as perfluoro($C_{1-12}$alkyl), particularly perfluoro anions of perfluorooctanesulfonate, perfluorononanesulfonate and the like. A specifically preferred PAG is N-[(perfluorooctanesulfonyl)oxy]-5-norborene-2,3-dicarboximide.

Sulfonate compounds are also may be employed such as sulfonate salts. Two suitable agents are the following PAGs 1 and 2:

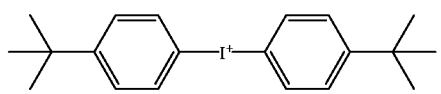

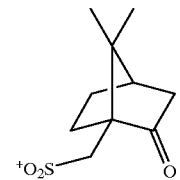

Such sulfonate compounds can be prepared as disclosed in European Patent Application 96118111.2 (publication number 0783136.

Also suitable are the above two iodonium compounds complexed with anions other than the above-depicted groups. In particular, preferred anions include those of the formula $RSO_3^-$ where R is adamantane, alkyl (e.g. $C_{1-12}$ alkyl) and perfluoroalkyl such as perfluoro ($C_{1-12}$ alkyl), particularly perfluoro counter anions of perfluorooctanesulfonate, perfluorononanesulfonate and the like.

Other known PAGs also may be employed in the resists of the invention. For example, N-sulfonyloxyimides may be employed such as those described in International application WO94/10608, or non-ionic halogenated PAGs that generate a halogen acid (e.g. HBr) upon exposure to activating radiation as described e.g. in U.S. Pat. No. 5,128,232 to Thackeray et al. and in European Patent Application Nos. 0164248 and 0232972.

A preferred optional component of resist compositions of the invention is a dye compound. Preferred dyes can enhance resolution of the patterned resist image, typically by reducing reflections and the effects thereof (e.g. notching) of the exposure radiation. Preferred dyes include substituted and unsubstituted phenothiazine, phenoxazine, anthracene and anthrarobin compounds. Preferred substituents of substituted phenothiazine, phenoxazine, anthracene and anthrarobin include e.g. halogen, $C_{1-12}$ alkyl, $C_{1-12}$ alkoxy, $C_{2-12}$ alkenyl, $C_{1-12}$ alkanoyl such as acetyl, aryl such as phenyl, etc. Copolymers of such compounds also may be used as a dye, e.g. an anthracene acrylate polymer or copolymer.

Another preferred optional additive is an added base, particularly tetrabutylammonium hydroxide (TBAH), or a lactate salt of TBAH, which can enhance resolution of a developed resist relief image. The added base used in relatively small amounts, e.g. about 1 to 20 percent by weight relative to the photoactive component (PAG).

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations such as, e.g. in amounts of from about 5 to 30 percent by weight of the total weight of a resist's dry components.

The compositions of the invention can be readily prepared by those skilled in the art. For example, a photoresist composition of the invention can be prepared by admixing the components of the photoresist in a suitable solvent such as, for example, ethyl lactate, a glycol ether such a 2-methoxyethyl ether (diglyme), ethylene glycol monomethyl ether, propylene glycol monomethyl ether; a Cellosolve ester such as methyl ethyl ketone; and 3-ethoxy ethyl propionate. Typically, the solids content of the composition varies between about 5 and 35 percent by weight of the total weight of the photoresist composition. The resin binder and PAG components should be present in amounts sufficient to provide a film coating layer and formation of good quality latent and relief images.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 300 mJ/cm$^2$, dependent upon the exposure tool and the components of the photoresist composition.

Coating layers of the resist compositions of the invention are preferably photoactivated by an exposure wavelength in the deep UV range i.e., 350 nm or less, more typically in the range of about 300 nm or less, typically about 150 to 300 or 450 nm. Particularly preferred exposures wavelength include 248 nm, 193 nm and 157 nm.

Following exposure, the film layer of the composition is preferably baked at temperatures ranging from about 70° C. to about 120° C. Thereafter, the film is developed. The exposed resist film is rendered positive working by employing a polar developer, preferably an aqueous based developer such as an inorganic alkali exemplified by sodium hydroxide, potassium hydroxide, sodium carbonate, or sodium bicarbonate.

Following development of the photoresist coating over the substrate, the coated substrate is then thermally treated (hard-bake), e.g. to at least about 120° C., more preferably at least about 130° C., 140° C. or 150° C. for a time sufficient to both flow the resist and to induce crosslinking of resist component(s). Preferred hard-bake temperatures are from about 130° C. to about 200° C., 210° C., 220° C., 230° C., 240° C., or 250° C., more typically 130° C., 140° C. 150° C. or 160° C. to about 180° C., 190° C. or 200° C. Post-development hard-bake temperatures of at least about 150° C., 160° C., 170° C., 180° C. or 190° C. also will be suitable. The post-development hard-bake may suitably be for about at least about 0.25, 0.51 or 2 minutes. Hard-bake in excess of about 2, 3 or 4 minutes are generally less preferred.

Thereafter, the substrate may be processed as desired. For the manufacture of microelectronic substrates, e.g., the manufacture of silicon dioxide wafers, suitable etchants include a gas etchant, e.g. a chlorine or fluorine-based etchant such a $CF_4$ or $CF_4/CHF_3$ etchant applied as a plasma stream. After such processing, resist may be removed from the processed substrate using known stripping procedures.

All documents mentioned herein are fully incorporated herein by reference. The following non-limiting examples are illustrative of the invention.

EXAMPLE 1

GPC Evaluations

Acetal-blocked poly(hydroxystyrene) was prepared with a primary (ethyl vinyl ether) and a tertiary vinyl ether (t-butylvinyl ether). Several resist formulations were prepared (see below; identified as Resists 1, 2, 3 and 4) and then spin-coated onto silicon wafers, soft-baked at less than about 110° C., exposed (6% PSM contact hole mask) to 248 nm radiation, developed with aqueous alkaline solution, post-exposure baked at not in excess of about 120° C., and hardbaked at not less than 130° C. The resists were then washed off the wafer and analyzed by GPC to monitor molecular weight distribution. For all the resists there was an increase in the high molecular weight distribution of the polymer after the resist was hardbaked (relative to the softbake or the resist alone). This would indicate that there is crosslinking (transacetalization) occurring during the hardbake.

A. Resist and Resin Preparation

Resist 1; Resist 1 has the following components formulated with a solvent that comprised ethyl lactate:
1. Polymer: poly(hydroxystyrene) that had phenolic sites blocked with t-butyl vinyl ether and t-butyloxycarbonyl-acid labile groups;
2. Photoacid generator (PAG) of di-tert-butylphenyliodonium camphor sulfonate; and
3. tetra-butyl ammonium hydroxide.

Resist 2; Resist 2 has the following components formulated with a solvent that comprised ethyl lactate:
1. Polymer: poly(hydroxystyrene) that had phenolic sites blocked with t-butyl vinyl ether and tBOC-acid labile groups; and
2. Photoacid generator (PAG) of di-tert-butylphenyliodonium camphor sulfonate.

Resist 3; Resist 3 has the following components formulated with a solvent that comprised ethyl lactate:
1. Polymer: poly(hydroxystyrene) that had phenolic sites blocked with t-butyl vinyl ether and tBOC-acid labile groups;
2. Photoacid generator (PAG) of di-tert-butylphenyliodonium camphor sulfonate;
3. tetra-butyl ammonium hydroxide; and
4. surfactant of FC-93.

Resist 4 (control). Resist 4 has the following components formulated with a solvent that comprised ethyl lactate:
1. Polymer: poly(hydroxystyrene) that had phenolic sites blocked with ethyl vinyl ether and tBOC-acid labile groups;
2. Photoacid generator (PAG) of di-tert-butylphenyliodonium camphor sulfonate; and 3. tetra-butyl ammonium hydroxide.

A partially hydrogenated poly(hydroxystyrene) (i.e. contains cyclohexyl alcohol units) also was prepared where the phenolic or cyclohexyl alcohol units were reacted with t-butylvinyl ether. GPC analysis of the reaction mixture indicated a large increase in the high molecular weight distribution of this polymer. The cyclohexyl t-butyl acetal groups produced such favorable conditions for trasacetaliztion that crosslinking occurred during the blocking reaction.

B. Resist Evaluation for Thermal Flow Margin

Resists 1, 2, 3, and 4 were evaluated for thermal flow. 180 nm contact holes were hardbaked at 145° C., 150° C., 155° C., and 160° C. For the resists containing the t-butylvinyl ether, there was a significant decrease in the flow rate relative to the ethylvinyl ether-blocked poly (hydroxystyrene) control. This result indicates that the use of a tertiary vinyl ether (and secondary vinyl ether) blocking groups produces improved thermal flow margin.

The foregoing description of the invention is merely illustrative thereof, and it is understood that variations and modification can be made without departing from the spirit or scope of the invention as set forth in the following claims.

What is claimed:

1. A method for treating a microelectronic wafer substrate, that comprises one or more contact holes,
    a) applying a photoresist composition comprising i) a photoactive component, ii) a polymer that comprises 1) groups reactive to crosslinking; and 2) photoacid-labile groups; and iii) a thermal acid generator compound onto a substrate;
    b) exposing and developing the photoresist layer on the substrate to yield a developed photoresist image; and
    c) thermally treating the developed photoresist layer to induce crosslinking of one or more photoresist components.

2. The method of claim 1 wherein the substrate is a microelectronic wafer.

3. The method of claim 1 wherein the photoresist layer is exposed to patterned radiation having a wavelength of about 248 nm.

4. The method of claim 1 wherein the photoresist layer is exposed to patterned radiation having a wavelength of less than 200 nm.

5. The method of claims 1 wherein the thermal treatment induces flow of the developed photoresist layer.

6. The method of claims 1 wherein the photoresist layer is heated after development to at least about 130° C.

7. The method of claims 1 wherein the the photoresist layer is heated after development to at least about 150° C.

8. The method claims 1 wherein the photoresist layer is heated after development to at least about 160° C.

9. The method of claims 1 wherein the photoresist is heated after exposure and prior to development at a temperature of not greater than about 120° C., and the pre-development heating does not cause substantial crosslinking of the photoresist layer.

10. The method of claim 1 wherein the photoresist groups comprise acetal groups.

11. The method of claim 10 wherein the acetal groups have an oxygen linkage that is substituted by a secondary or tertiary carbon.

12. The method of claim 1 wherein the photoresist polymer comprises phenolic units.

13. The method of claim 1 wherein the photoresist polymer comprises cycloalkyl units.

14. The method of claim 1 wherein the photoresist polymer comprises alkylacrylate photoacid labile groups.

15. The method of claim 1 wherein the polymer is substantially free of aromatic groups.

16. The method of claim 1 wherein the polymer is completely free of aromatic groups.

17. The method of claim 1 wherein the photoacid-labile groups are primary acetal groups.

18. The method of claim 17 wherein the groups reactive to crosslinking are tertiary acetal groups.

19. A method for treating a microelectronic wafer substrate that comprises one or more contact holes,
    a) applying a photoresist composition comprising i) a photoactive component, ii) a polymer that comprises 1) groups reactive to crosslinking; 2) alkyl-acrylate photoacid-labile groups; and 3) phenolic groups; and iii) a thermal acid generator compound onto a substrate;
    b) exposing and developing the photoresist layer on the substrate to yield a developed photoresist image; and
    c) thermally treating the developed photoresist layer to induce crosslinking of one or more photoresist component.

20. The method of claim 19 wherein the photoresist layer is exposed to patterned radiation having a wavelength of about 248 nm.

21. The method of claim 19 wherein the photoacid-labile groups are primary acetal groups.

22. The method of claim 19 wherein the groups reactive to crosslinking are tertiary acetal groups.

23. A method for treating a microelectronic wafer substrate that comprises one or more contact holes,
    a) applying a photoresist composition comprising a photoactive component and a polymer that comprises 1) groups reactive to crosslinking, and 2) primary acetal photoacid-labile groups, the polymer being substantially free of aromatic groups onto a substrate;
    b) exposing and developing the photoresist layer on the substrate to yield a developed photoresist image; and
    c) thermally treating the developed photoresist layer to induce crosslinking of one or more photoresist components.

24. The method of claim 23 wherein the polymer is completely free of aromatic groups.

25. The method 23 wherein the groups reactive to crosslinking are acetal groups.

26. The method of claim 25 wherein the groups reactive to crosslinking are tertiary acetal groups.

27. The method of claim 23 wherein the photoresist further comprises a thermal acid generator compound.

28. The method of claim 23 wherein the photoresist layer is exposed to patterned radiation having a wavelength of less than 200 nm.

29. The method of claim 23 wherein the photoresist layer is exposed to patterned radiation having a wavelength of 193 nm.

* * * * *